(12) United States Patent
Torwesten et al.

(10) Patent No.: US 8,945,990 B2
(45) Date of Patent: Feb. 3, 2015

(54) CHIP PACKAGE AND METHOD OF FORMING THE SAME

(75) Inventors: Holger Torwesten, Regensburg (DE); Manfred Mengel, Bad Abbach (DE); Stefan Schmid, Painten (DE); Soon Lock Goh, Melaka (MY); Swee Kah Lee, Melaka (MY)

(73) Assignee: Infineon Technologies AG, Neubiberg (DE)

(*) Notice: Subject to any disclaimer, the term of this patent is extended or adjusted under 35 U.S.C. 154(b) by 392 days.

(21) Appl. No.: 13/454,115

(22) Filed: Apr. 24, 2012

(65) Prior Publication Data
US 2013/0277813 A1    Oct. 24, 2013

(51) Int. Cl.
*H01L 21/00*    (2006.01)

(52) U.S. Cl.
USPC ......... 438/118; 438/119; 438/127; 438/608; 257/676; 257/677; 257/787; 257/E23.031; 257/E21.499

(58) Field of Classification Search
None
See application file for complete search history.

(56) References Cited

U.S. PATENT DOCUMENTS

| | | | |
|---|---|---|---|
| 4,499,152 A * | 2/1985 | Green et al. | 428/448 |
| 2008/0261020 A1 | 10/2008 | Kawaguchi et al. | |
| 2011/0042799 A1 * | 2/2011 | Kang et al. | 257/692 |
| 2011/0198743 A1 | 8/2011 | Nikitin et al. | |
| 2012/0247814 A1 * | 10/2012 | Shimizu et al. | 174/251 |

* cited by examiner

*Primary Examiner* — Yasser A Abdelaziez

(57) ABSTRACT

Embodiments provide a method of forming a chip package. The method may include attaching at least one chip on a carrier, the chip including a plurality of chip pads on a surface of the chip opposite to the carrier; depositing a first adhesion layer on the carrier and on the chip pads of the chip, the first adhesion layer including tin or indium; depositing a second adhesion layer on the first adhesion layer, the second adhesion layer including a silane organic material; and depositing a lamination layer or an encapsulation layer on the second adhesion layer and the chip.

9 Claims, 12 Drawing Sheets

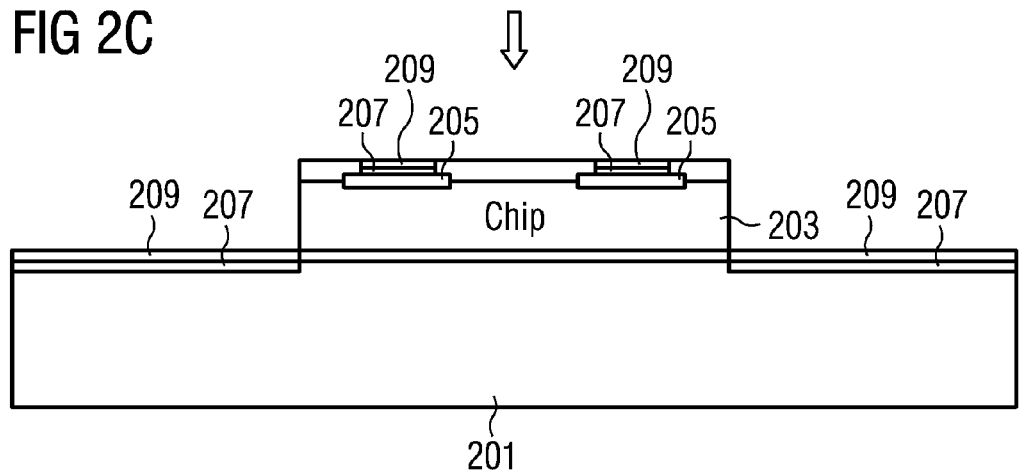
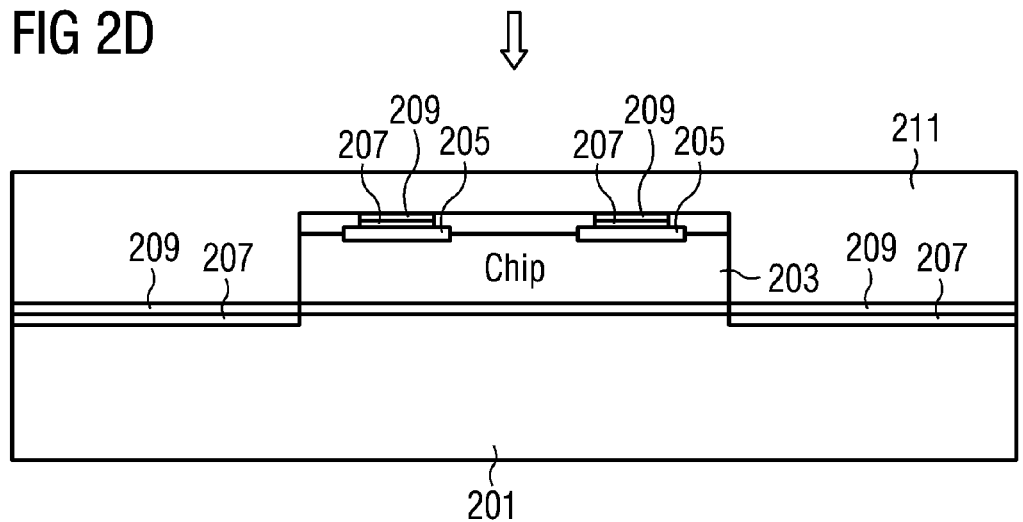

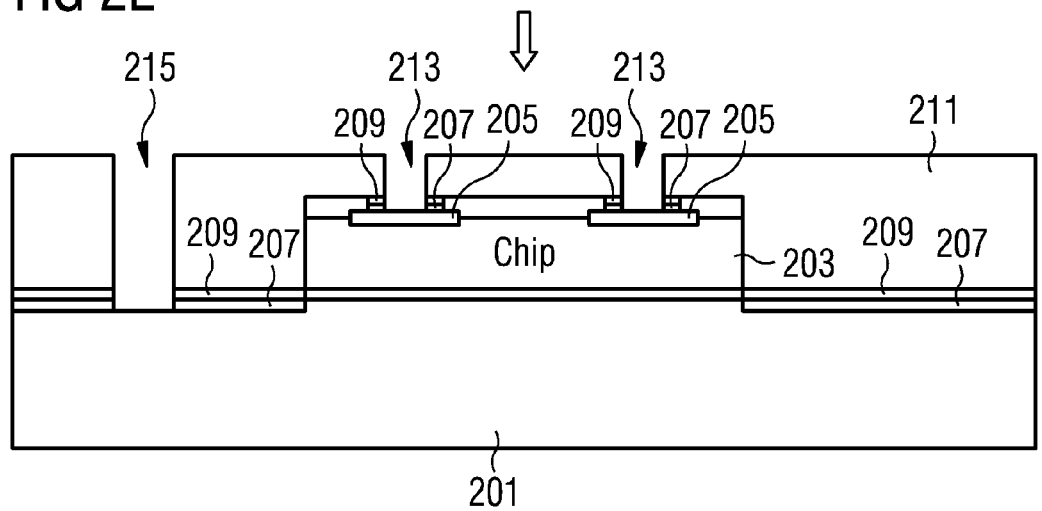
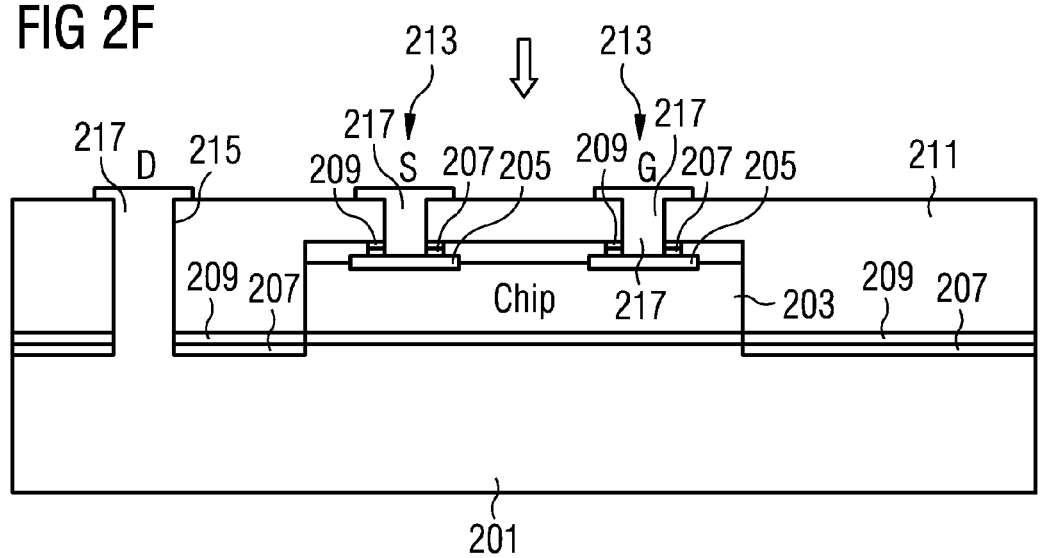

(a)

(b)

| Oxide surface | IEPS | Oxide surface | IEPS |
|---|---|---|---|
| $Ag^+$ | >12.0 | $Zn^{2+}$ | 9.0 |
| $Mg^{2+}$ | 12.2 | $Al^{3+}$ | 9.1 |
| $Fe^{2+}$ | 12.0 | $Fe^{3+}$ | 8.5 |
| $Co^{2+}$ | 11.3 | $Cr^{3+}$ | 7.0 |
| $Ni^{2+}$ | 11.0 | $Zr^{2+}$ | 6.5 |
| $Pb^{2+}$ | 10.3 | $Ti^{4+}$ | 6.0 |
| $Cd^{2+}$ | 10.3 | $Sn^{4+}$ | 4.5 |
| $Be^{2+}$ | 10.1 | $Mn^{3+}$ | 4.2 |
| $Cu^{2+}$ | 9.1 | $Si^{4+}$ | 2.2 |

CHIP PACKAGE AND METHOD OF FORMING THE SAME

TECHNICAL FIELD

Embodiments relate generally to chip packages and a method of forming the chip packages.

BACKGROUND

In the chip-embedding packaging technology, e.g. for power modules, the chip is embedded with a laminate after the chip has been mounted onto the substrate ("Die Attach") and the Source-and-Gate-Contact at the chip front side is opened by means of a laser and is subsequently filled galvanically.

In order to achieve a better adhesion of the laminate to the copper substrate, the copper substrate is usually roughened or textured before lamination by means of a wet-chemical process. In that case, the etch chemistry should be set such that the chip connection material, e.g. the diffusion solder or the conducting adhesive, does not dissolve. Furthermore, the active front side of the chip should not be damaged by means of the texturing process. The adhesion between the chip carrier material and the laminate should stand the stress load, which occurs e.g. at the temperature-cycles, the high temperature, storing and wet-storing.

One approach of roughening or texturing process is to use different chemicals, inter alia by means of strong-etching sulphur acids as well as hydrogen peroxide etc (which is unknown organics). In this approach, the substrate with the mounted components is given into the bath of the above mentioned chemicals at a specific temperature and for a predetermined time period.

However, complex bath processing with concentration and temperature variations is required in the conventional processes, which may also cause variations in the roughness and thus in the adhesion of the laminate to the substrate. The organic components of the supplier companies are unknown, and the effect of the residual products is unknown. Setting of the processes to corresponding substrate surface and leadframe plating is required. In addition, there is a risk of under-etching of the regions between chip and substrate. In etching of the chip pad-copper-metallization, higher costs are incurred due to the required thicker copper layer on the chip pads. Etching away of the aluminum chip rear side metallization at the open edges is needed, and thus adhesion problems of the chip rear side metallization, in particular, after stress load exist (etch medium residuals in the etched gap cause local element with electro-chemical corrosion in the humidity test). Further, there is limitation with respect to the selection of chip adhesives.

In chip packages, delamination may occur between mold compound and the chip carrier, e.g., between mold compound and the leadframe on the chip carrier. One approach is to use adhesion promoter, such as A2, moldPrep and uPPF, to enhance the adhesion between mold compound and the leadframe. However, these adhesion promoter may cause poor wire bondability and high cost, wherein contamination of the adhesion promoter residue may affect wire bondability.

SUMMARY

An embodiment provides a method of forming a chip package. The method may include attaching at least one chip on a carrier, the chip including a plurality of chip pads on a surface of the chip opposite to the carrier; depositing a first adhesion layer on the carrier and on the chip pads of the chip, the first adhesion layer including tin or indium; depositing a second adhesion layer on the first adhesion layer, the second adhesion layer including a silane organic material; and depositing a lamination layer or an encapsulation layer on the second adhesion layer and the chip.

Another embodiment provides a method of forming a chip package. The method may include attaching at least one chip on a carrier; forming interconnections between the chip and the carrier; depositing a tin layer on the carrier and on the interconnections; and depositing an encapsulation layer on the tin layer and on the chip.

A further embodiment provides a method of forming a chip package. The method may include depositing an adhesion layer including tin material on selected regions of a carrier; attaching at least one chip on the adhesion layer deposited on at least one of the selected regions of the carrier; forming interconnections between the chip and at least one of the selected regions of the carrier; and depositing an encapsulation layer on the carrier, the adhesion layer and the chip.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which:

FIGS. 2A-2F show a process for forming a chip package according to an embodiment.

FIG. 10 shows the IEPS value of various materials.

DESCRIPTION

Figure 1:
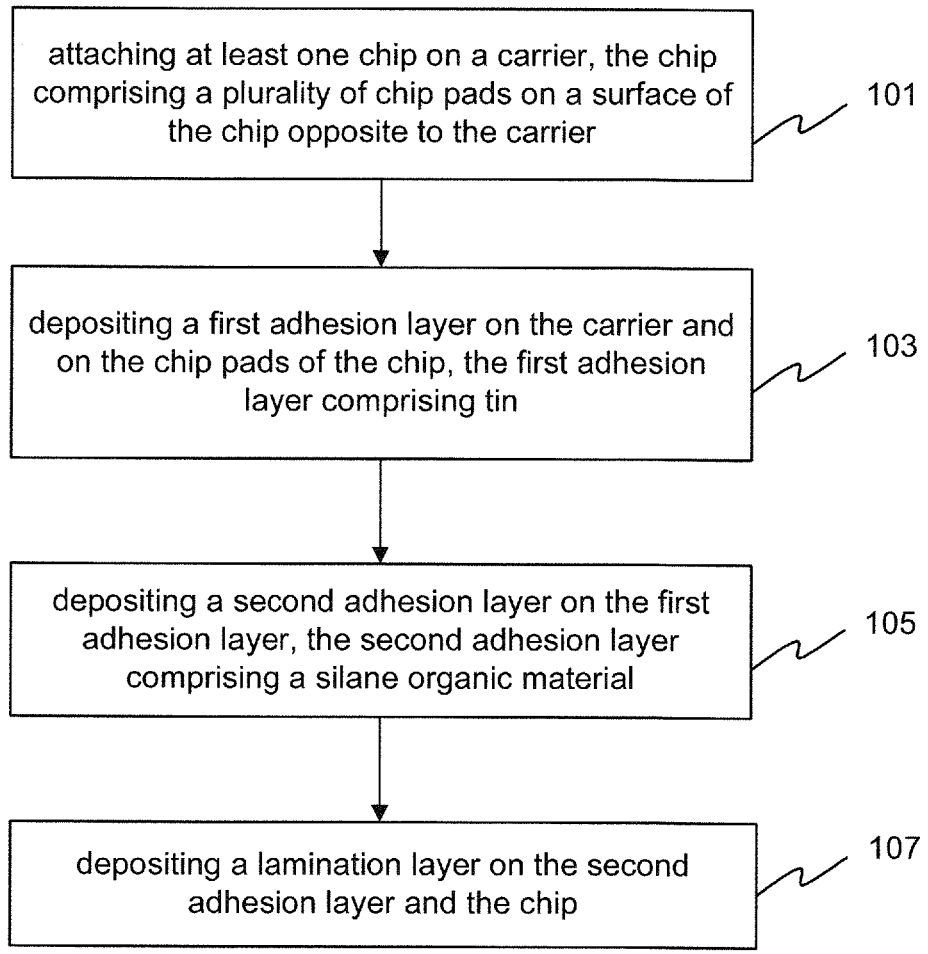
FIG. 1 shows a flowchart illustrating a method of forming a chip package according to an embodiment.

Various embodiments provide a reliable chip package, e.g. a chip embedded package, with a good adhesion between the laminate and the chip carrier.

Various embodiments provide a robust chip package having a good adhesion between the encapsulation and the chip carrier, and good die/wire bondability.

Embodiments described below in context of the method of forming a chip package are analogously valid for the respective chip packages formed using the respective method, and vice versa.

In this context, a carrier is a substrate on which the chip is mounted and packaged. The carrier may include a leadframe and may include metal, e.g. copper or other suitable material, such as a copper alloy or a ferrous alloy, providing electrical connection and mechanical support for the chip.

In various embodiments, at least one of a plurality of chips may include at least part of a wafer substrate. Alternatively, each of plurality of chips may include at least part of a wafer substrate. At least one of plurality of chips may include one or more electronic circuits formed within the wafer substrate, e.g. which may have already been formed through an earlier front end process. At least one of plurality of chips may include at least part of a power semiconductor chip, wherein the power semiconductor chip may include at least one power semiconductor device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

It may be understood that the plurality of chips may not be limited to power semiconductor devices, but may also include logic devices, e.g. an application specific integrated chip ASIC or a programmable processor such as e.g. a programmable microprocessor, e.g. a driver, e.g. a controller, e.g. a sensor, and/or memory devices such as random access memory devices including volatile and/or non-volatile memory devices.

One embodiment is directed to a method of forming a chip package. The method may include attaching at least one chip on a carrier, the chip including a plurality of chip pads on a surface of the chip opposite to the carrier; depositing a first adhesion layer on the carrier and on the chip pads of the chip, the first adhesion layer including tin or indium; depositing a second adhesion layer on the first adhesion layer, the second adhesion layer including a silane organic material; and depositing a lamination layer or an encapsulation layer on the second adhesion layer and the chip.

In an embodiment, attaching at least one chip on a carrier includes attaching at least one chip on a leadframe.

In an embodiment, the chip may be attached on the carrier via die bonding using printable pastes or die attach films.

In an embodiment, the first adhesion layer may include pure tin. In another embodiment, the first adhesion layer may include a tin alloy, wherein the tin alloy may include tin and one or more other metals. In one embodiment, the first adhesion layer may include a tin nickel alloy. In other embodiments, the first adhesion layer may include a tin lead alloy, a tin silver alloy or a tin copper alloy.

In another embodiment, the first adhesion layer may include pure indium. In a further embodiment, the first adhesion layer may include an indium alloy, wherein the indium alloy may include indium and one or more other metals.

According to an embodiment, a plurality of vias to selected chip pads and selected region of the carrier is formed, wherein the vias extend through the lamination layer, the first adhesion layer and the second adhesion layer. In an embodiment, the plurality of vias are formed by laser drilling. In another embodiment, the plurality of vias may be formed by mechanical drilling, or plasma etching process. The selected chip pads may include contact pads to source and/or drain of one or more transistors of the chip, for example.

In an embodiment, the plurality of vias are galvanically filled with electrically conductive material, so as to realize electrical connection to the selected chip pads and to the selected region of the carrier. In a further embodiment, the electrical connection is structured or patterned to realize desired circuit pattern.

According to an embodiment, the lamination layer may include a dielectric film material. In an embodiment, the lamination layer may include a resin-coated-copper (RCC) material. In another embodiment, the lamination layer may include a copper clad laminate.

According to another embodiment, the encapsulation layer may include an encapsulation material. The encapsulation material may include at least one from the following group of materials, the group consisting of: filled or unfilled epoxy, pre-impregnated composite fibers, reinforced fibers, laminate, a mold material, a mold compound, a thermoset material, a thermoplastic material, filler particles, fiber-reinforced laminate, fiber-reinforced polymer laminate, fiber-reinforced polymer laminate with filler particles.

Another embodiment is directed to a chip package. The chip package may include a carrier; at least one chip attached on the carrier, the chip including a plurality of chip pads on a surface of the chip opposite to the carrier; a lamination layer or an encapsulation layer disposed over the carrier and the chip; a plurality of vias extending through the lamination layer or the encapsulation layer to selected chip pads and selected regions of the carrier; and an adhesion layer formed inbetween the carrier and the lamination layer or the encapsulation layer and formed inbetween the chip pads and the lamination layer or the encapsulation layer. The adhesion layer includes a silane organic material.

In an embodiment, the carrier may include a leadframe.

A further embodiment provides a method of forming a chip package. The method may include attaching at least one chip on a carrier; forming interconnections between the chip and the carrier; depositing a tin layer on the carrier and on the interconnections; and depositing an encapsulation layer on the tin layer and on the chip.

In an embodiment, attaching at least one chip on a carrier includes attaching at least one chip on a leadframe.

In a further embodiment, the method may include depositing a tin layer under the carrier.

A further embodiment provides a chip package. The chip package includes a carrier; at least one chip attached on the carrier; interconnections between the chip and the carrier; a tin layer deposited on the carrier and the interconnections; and an encapsulation layer deposited on the tin layer and on the chip.

In an embodiment, the carrier may include a leadframe.

Another further embodiment provides a method of forming a chip package. The method may include depositing an adhesion layer including tin material on selected regions of a carrier; attaching at least one chip on the adhesion layer deposited on at least one of the selected regions of the carrier; forming interconnections between the chip and at least one of the selected regions of the carrier; and depositing an encapsulation layer on the carrier, the adhesion layer and the chip.

In an embodiment, depositing an adhesion layer including tin material on selected regions of a carrier may include depositing an adhesion layer including tin material on selected regions of a leadframe.

In an embodiment, the method may further include depositing the adhesion layer under the carrier.

According to one embodiment, the adhesion layer may include a tin silver alloy. In one example, the tin silver alloy may include 80% tin (Sn) and 20% silver (Ag). In another example, the tin silver alloy may include 20%-30% silver. In other examples, the tin silver alloy may include tin and silver with other proportions, such as 10/90 AgSn, 30/70 AgSn, 40/60 AgSn, which enhances adhesion strength to the encapsulation layer. In an embodiment, the adhesion layer including the tin silver alloy may have a thickness of at least 2 µm.

According to another embodiment, the adhesion layer may include a tin gold alloy with suitable proportion between tin and gold, so as to enhance adhesion strength between the carrier and the mold compound.

According to a further embodiment, the adhesion layer may include a tin layer sandwiched between a first silver layer and a second silver layer. In an embodiment, the tin layer may have a thickness of about 2 μm to 3 μm; the first silver layer contacts with the carrier and may have a thickness of about 1 μm to 2 μm; and the second silver layer may have a thickness of about 0.1 μm to 1 μm. The first silver layer may prevent diffusion of carrier material, e.g. copper, to the tin layer. The tin interlayer may enhance the adhesion strength. The second silver layer may enable wire bond and die bond between the chip and the carrier.

In an embodiment, the method may further include depositing the adhesion layer under the carrier.

A further embodiment is directed to a chip package. The chip package may include a carrier; an adhesion layer including tin material and deposited on selected regions of the carrier; at least one chip attached on the adhesion layer deposited on at least one of the selected regions of the carrier; interconnections formed between the chip and at least one of the selected regions of the carrier; and an encapsulation layer deposited on the carrier, the adhesion layer and the chip.

In an embodiment, the carrier may include a leadframe.

FIG. 1 shows a flowchart illustrating a method of forming a chip package according to an embodiment.

At 101, at least one chip is attached on a carrier, wherein the chip includes a plurality of chip pads on a surface of the chip opposite to the carrier. In an embodiment, the chip may be attached on the carrier by die bonding using a solder or epoxy bond.

At 103, a first adhesion layer is deposited on the carrier and on the chip pads of the chip. The first adhesion layer may include tin.

At 105, a second adhesion layer is deposited on the first adhesion layer. The second adhesion layer may include a silane organic material.

At 107, a lamination layer is deposited on the second adhesion layer and the chip.

FIGS. 2A-2F illustrate a process for forming a chip package according to an embodiment.

Figure 2A:
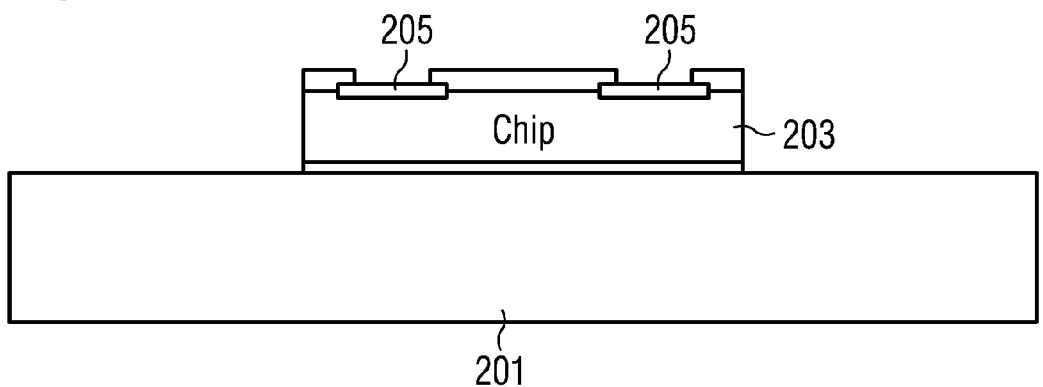

In FIG. 2A, at least one chip 203 (only one chip is shown in this embodiment) is attached on a carrier 201. The chip 203 may be attached on the carrier 201 by die bonding using a solder or epoxy bond. In an embodiment, the chip 203 may be attached on a leadframe formed as the carrier 201. The chip 203 may include a plurality of chip pads 205 on a surface of the chip 203 opposite to the carrier 201. In an embodiment, one or more of the chip pads 205 may be contact pads at the source or drain terminal of one or more transistors in the chip 203.

In an embodiment, the carrier may include copper. In another embodiment, the carrier may include a copper alloy, such as an alloy including Cu, Cr, Sn, Zn; or an alloy including Cu, Ni, Si, Zn, Ag. In a further embodiment, the carrier may include a ferrous alloy.

Figure 2B:
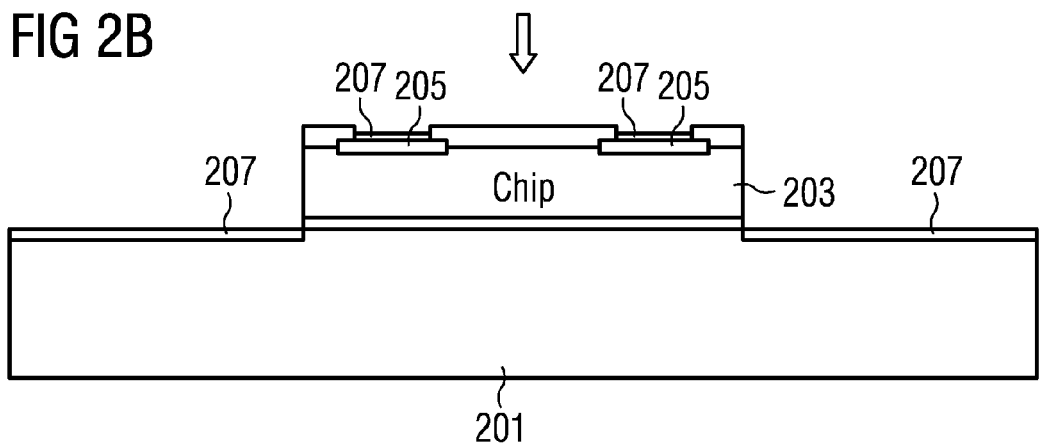

In FIG. 2B, a first adhesion layer 207 is deposited on the carrier 201 and on the chip pads 205 of the chip 203. The first adhesion layer 207 may include tin or indium. In an embodiment, the first adhesion layer may include pure tin. In another embodiment, the first adhesion layer 207 may include a tin alloy, which includes tin and one or more other metals. In an embodiment, the first adhesion layer 207 may include a tin nickel (Sn—Ni) alloy, or may include a tin lead alloy, a tin silver alloy or a tin copper alloy. In another embodiment, the first adhesion layer 207 may include pure indium. In a further embodiment, the first adhesion layer 207 may include an indium alloy, wherein the indium alloy may include indium and one or more other metals.

In an embodiment, the first adhesion layer 207 is formed by chemical deposition of a Sn and Ni mixture on the carrier 201 and on the chip pads 205. In one embodiment, the first adhesion layer 207 is formed on the carrier 201 and on the chip pads 205 by electroless plating. In other embodiment, the first adhesion layer 207 may be formed using other suitable processes, such as chemical vapor deposition, physical vapor deposition or electroplating.

In an embodiment, the first adhesion layer 207 may be deposited in a thickness of about 10 nm-100 nm. In other embodiments, the first adhesion layer 207 may be deposited in a thickness of about 50 nm-100 nm, 60 nm-90 nm, 70 nm-80-nm, 20 nm-90 nm, 30 nm-80 nm, 40 nm-70 nm, or 50 nm-60 nm, etc.

In one embodiment, the first adhesion layer 207 may completely diffuse into the underlying carrier 201 during the subsequent processing, and may not remain in the finally formed chip package. In another embodiment, the first adhesion layer 207 may partially diffuse into the underlying carrier 201 during the subsequent processing.

In FIG. 2C, a second adhesion layer 209 is deposited on the first adhesion layer 207. The second adhesion layer 209 may include a silane organic material.

In an embodiment, the second adhesion layer 209 may be formed on the first adhesion layer 207 by applying a solution of silane organic material onto the first adhesion layer 207, or by dipping the first adhesion layer 207 in the solution of silane organic material. In an embodiment, the silane organic layer may be coated by chemical vapor deposition or physical vapor deposition with a thickness in the range of atomic monolayers up to 100 nm.

In FIG. 2D, according to one embodiment, a lamination layer 211 is deposited on the second adhesion layer 209 and the chip 203. In an embodiment, the lamination layer 211 including a resin-coated-copper (RCC) material is formed. In an embodiment, the resin of RCC material may include an epoxy resin filled by glass fiber. In another embodiment, a copper clad laminate having corresponding cutouts of the copper layer at the chip pad locations is formed as the lamination layer 211. The lamination layer 211 may be formed with a thickness of 30 μm-300 μm. In other embodiments, the lamination layer 211 may be formed with a thickness of about 60 μm-150 μm, or 80 μm-110 μm. The lamination layer 211 may be formed by vacuum lamination, or other suitable processes.

In FIG. 2D, according to another embodiment, an encapsulation layer 211 is deposited on the second adhesion layer 209 and the chip 203. In an embodiment, the encapsulation layer 211 may include an encapsulation material. The encapsulation material may include at least one from the following group of materials, the group consisting of: filled or unfilled epoxy, pre-impregnated composite fibers, reinforced fibers, laminate, a mold material, a mold compound, a thermoset material, a thermoplastic material, filler particles, fiber-reinforced laminate, fiber-reinforced polymer laminate, fiber-reinforced polymer laminate with filler particles.

In an embodiment, the encapsulation layer 211 may be deposited by Glob Top, wherein encapsulation material is deposited on the second adhesion layer 209 and the chip 203, and is cured afterwards. In another embodiment, the encapsulation layer 211 may be deposited by Dam-and-Fill, which utilizes a dam around the periphery of the carrier 201.

In FIG. 2E, a plurality of vias 213, 215 to selected chip pads 205 and selected region of the carrier 201 are formed. The vias 213, 215 extends through the lamination layer 211, the first adhesion layer 207 and the second adhesion layer 209 to contact the selected region of the carrier 201 and the selected chip pads 205. The vias 213, 215 may be formed by laser drilling, in an embodiment. In another embodiment, the vias 213, 215 may be formed by mechanical drilling, or plasma etching, or other suitable processes.

In FIG. 2F, the plurality of vias 213, 215 are galvanically filled with electrically conductive material, e.g., copper, silver, tin, tin-lead, etc., so as to realize electrical connection to the selected chip pads and to the selected region of the carrier. In another embodiment, the plurality of vias 213, 215 may be filled with electrically conductive material by plating, such that the surfaces of the inner walls of the vias are covered with electrically conductive material. In an embodiment, the electrical connection formed thereby may be further structured or patterned to realize a desired circuit pattern.

In an embodiment as shown in FIG. 2F, the vias 213 to a source terminal and a gate terminal are formed, and the vias 215 to a drain terminal is formed. In other embodiments, the vias 213, 215 and the electrical connection formed thereby may be formed for other circuit components.

FIG. 2F shows a chip-embedded package formed according to an embodiment. In another embodiment, the chip package finally formed according to the process of FIGS. 2A-2F may be similar to the chip package of FIG. 2F but without the first adhesion layer 207, since the first adhesion layer 207 may diffuse completely into the carrier 201.

According to the above embodiments of FIG. 1 and FIGS. 2A-2F, a strong adhesion of the lamination layer or the encapsulation layer to the carrier is achieved by the first adhesion layer having tin or indium (e.g. pure tin or tin alloy, e.g. Sn—Ni alloy, e.g. pure indium or indium alloy) and the second adhesion layer of silane-organic.

Figure 3:
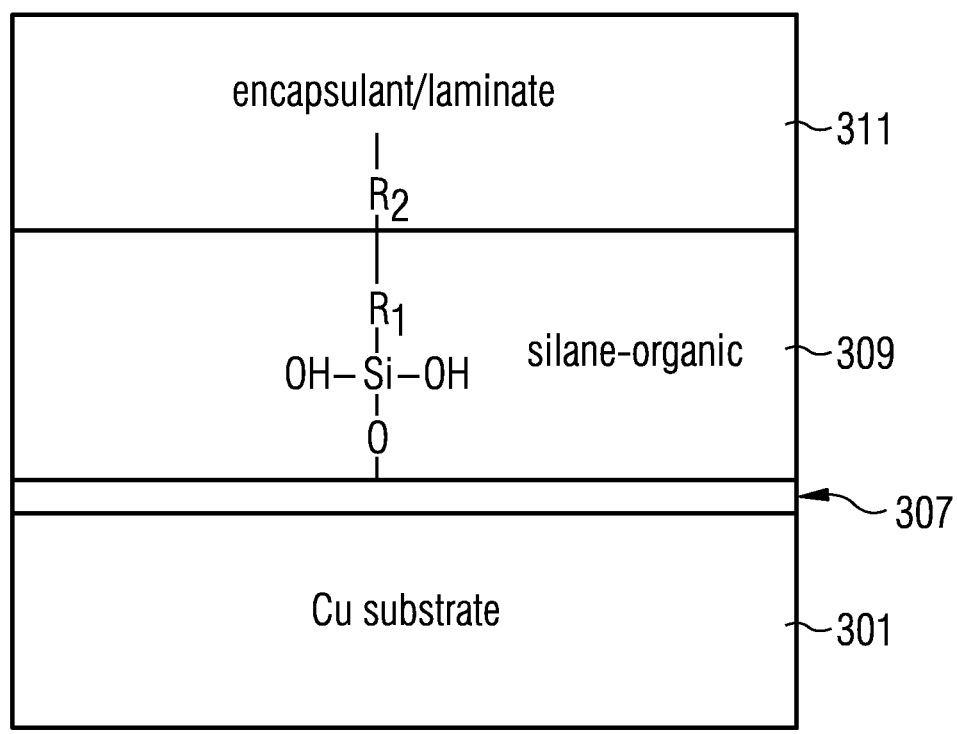
FIG. 3 illustrates the chemical bonding between adhesion layers and a laminate/encapsulate according to an embodiment.

In an illustrative example as shown in FIG. 3, a pure Sn layer or a Sn—Ni alloy layer 307 is applied as the first adhesion layer 307 onto a copper (Cu) substrate 301 used as the carrier and the chip pads 301. The first adhesion layer 307 may partially or completely diffuse into the copper substrate 301. An adhesion coupling silane-organic layer 309 is deposited on the Si layer or the Sn—Ni alloy layer 307 as the second adhesion layer, which forms a chemical binding between the metallic Sn layer or Sn—Ni alloy layer 307 and the lamination/encapsulation layer 311 during the lamination/encapsulation process. The lamination/encapsulation layer 311 may include resin. By optimizing the concentration and the processing, chemically stable bindings can be formed.

Silane coupling agent included in the adhesion coupling silane-organic layer 309 may possess a reaction group that chemically bonds to the resin lamination/encapsulation layer 311 and a reaction group that chemically bonds to the Sn layer or Sn—Ni alloy layer 307. Typically, silane coupling agents have the structure X—Y—SiZ$_3$, where X is a functional group capable of interacting or reacting with the polymeric resin, Y is an organic linkage, and at least one Z is a reactive or hydrolyzable group capable of reacting with the Sn layer or Sn—Ni alloy layer 307. In the example of FIG. 3, X corresponds to R$_2$ and Y corresponds to R$_1$, wherein R$_1$ and R$_2$ may be a carbon- (C—) or Si—O— chain with C, H, O, N, S or Si as side-atoms. Z corresponds to —OH. The X group may bond with the polymeric resin, and the SiZ$_3$ group may bond to the Sn layer or Sn—Ni alloy layer 307 which is partially or completely diffused into the metal substrate 301. This provides a chemical link (covalent bonds) from the polymeric resin to the metal substrate through the organic group Y, thereby improving adhesion of the polymeric resin to the metal substrate.

Examples of the silane coupling agent included in the silane-organic layer 309 that can be used may include but is not limited to y-aminopropyltrimethoxysilane (y-APS), y-glycidoxypropyltrimethoxysilane (y-GPS), bistrimethoxysilylpropylaminosilane (BTSPA), and N-(3(aminoethyl)Y-aminopropyltrimethoxysilane.

In an embodiment wherein Sn—Ni alloy layer is used as the first adhesion layer, the roughness of the Sn—Ni alloy layer can be optimized such that nano-porous regions (the maximum/average dimension of which is less than 100 nm) may be generated, which has an increased adhesion force compared with the copper substrate without the Sn—Ni alloy adhesion layer.

Instead of using the process of copper texturing, the above embodiments apply a double layer including a tin or indium layer and a silane-organic layer to the carrier and the chip pad metallization as stable adhesion layer between the carrier and the lamination/encapsulation layer. According to these embodiments, strong adhesion of the laminate/encapsulate to the carrier is achieved by means of chemical bindings. In addition, increased adhesion of the laminate/encapsulate to the stress-sensitive locations of the source and gate contact at the front side of the chip is achieved. Further, chip surface damages and chip adhesive etchings during the substrate/carrier processing according to conventional approaches can be avoided. Saving of galvanically applied copper pad thickness at the front side of the chip can also be achieved.

Figure 4:
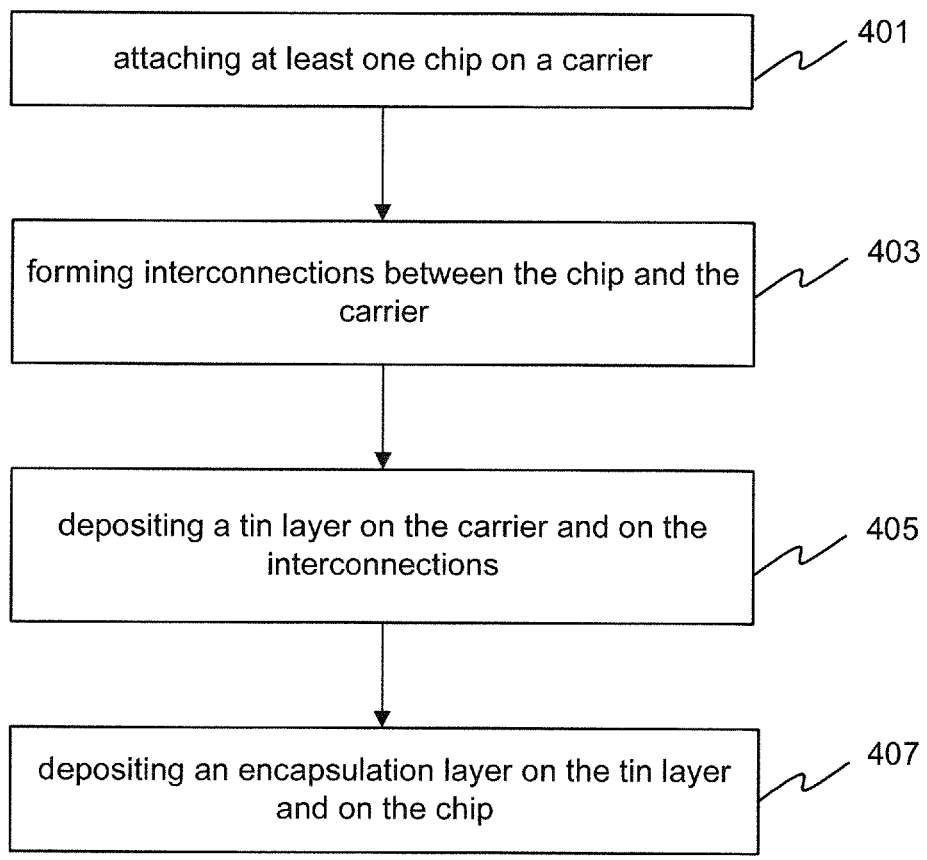
FIG. 4 shows a flowchart illustrating a method of forming a chip package according to another embodiment.

FIG. 4 shows a flowchart illustrating a method of forming a chip package according to another embodiment.

At 401, at least one chip is attached on a carrier. In an embodiment, the chip may be attached on a leadframe, wherein the leadframe may be formed as the carrier.

At 403, interconnections between the chip and the carrier are formed.

At 405, a tin layer is deposited on the carrier and on the interconnection.

In an embodiment, a tin layer is also deposited under the carrier.

At 407, an encapsulation layer is deposited on the tin layer and on the chip.

FIGS. 5A-5D illustrate a process for forming a chip package according to another embodiment.

Figure 5A:
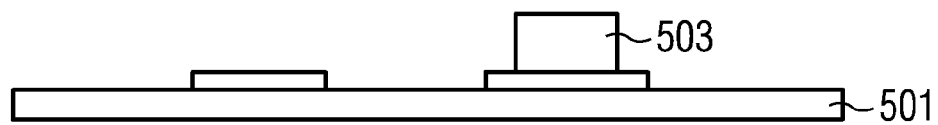
FIGS. 5A-5D illustrate a process for forming a chip package according to another embodiment.

In FIG. 5A, at least one chip 503 (only one chip is shown in this embodiment) is attached on a carrier 501. The chip 503 may be attached on the carrier 501 by die bonding using a solder or epoxy bond. In an embodiment, the chip 503 may be attached on the carrier 501 by epoxy bonding or eutectic bonding. In an embodiment, the chip 503 may be attached on a leadframe formed as the carrier 501.

Figure 5B:
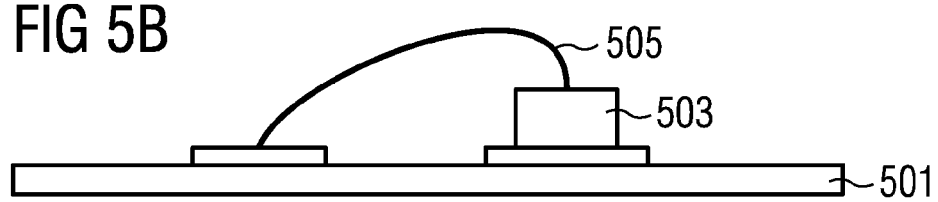

In FIG. 5B, an interconnection 505 between the chip 503 and the carrier 501 is formed, for example, by wire bonding. In some embodiments, the interconnection 505 may be formed using solder bond, aluminum wire bond, gold wire bond, or copper wire bond by thermosonic bonding or laser bonding.

Figure 5C:
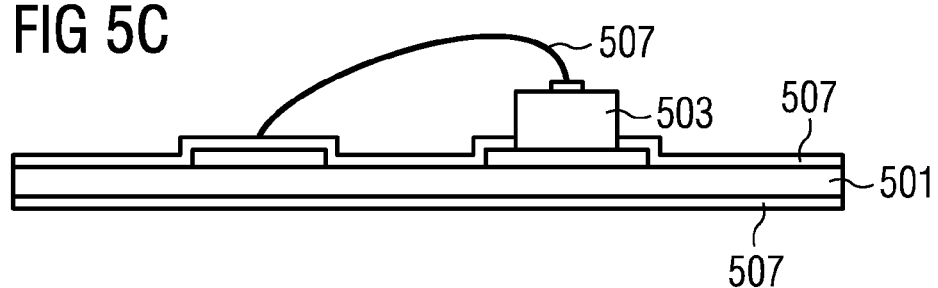

In FIG. 5C, a tin (Sn) layer 507 is deposited on the carrier 501 and on the interconnection 505. The tin layer 507 may include pure tin. The tin layer 507 may be deposited by electrolytic tin plating in one example, or by immersion tin plating in another example. In an embodiment, the tin layer 507 may be formed with a thickness of about 2 μm-4 μm. In another embodiment, the tin layer 507 may be formed with a thickness of about 3 μm.

In this embodiment, since the tin layer 507 is deposited after die bonding and wire bonding, it is also referred to as a Sn post-plate layer.

In an embodiment, the tin layer 507 may also be deposited under the carrier 501, e.g., for making solder pads under the carrier 501.

Figure 5D:
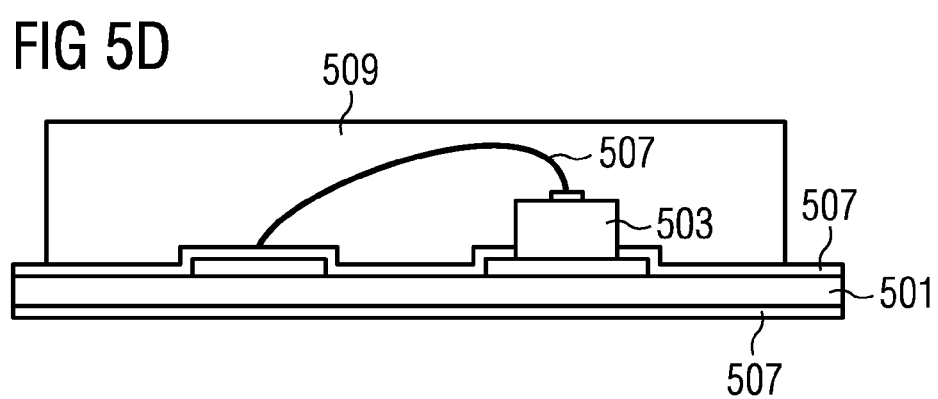

In FIG. 5D, an encapsulation layer 509 is deposited on the tin layer 507 and on the chip 503, thereby forming a chip package according to an embodiment. In an embodiment, the encapsulation layer 509 may be deposited by compression molding, transfer molding, injection molding, or other suitable processes.

In an embodiment, the encapsulation layer 509 may include an encapsulation material. The encapsulation material may include at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

FIG. 6(a) shows a structure wherein a chip 503 is attached on the carrier 501 and interconnections 505 are formed between the chip 503 and the carrier 501, before depositing the tin layer.

FIG. 6(b) shows a structure wherein a tin layer 507 is deposited on the carrier 501 of FIG. 6(a), e.g. the conductive part of the carrier 501, and the tin layer 507 is deposited on the interconnections 505 of FIG. 6(a).

Figure 6:
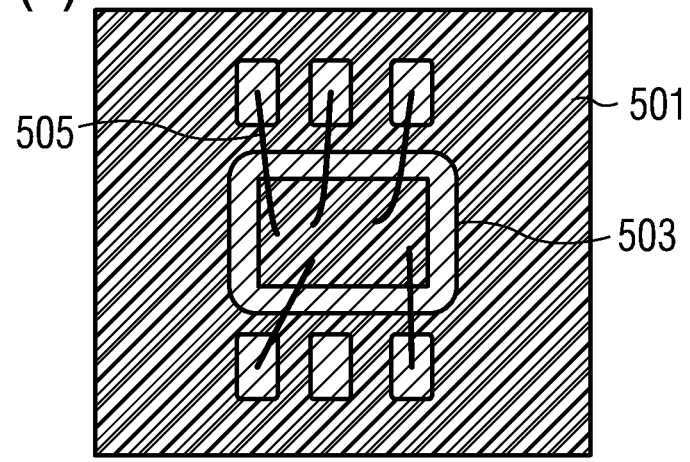
FIG. 6 shows a structure before and after deposition of a tin layer according to an embodiment.
Figure 6:
Figure 6:
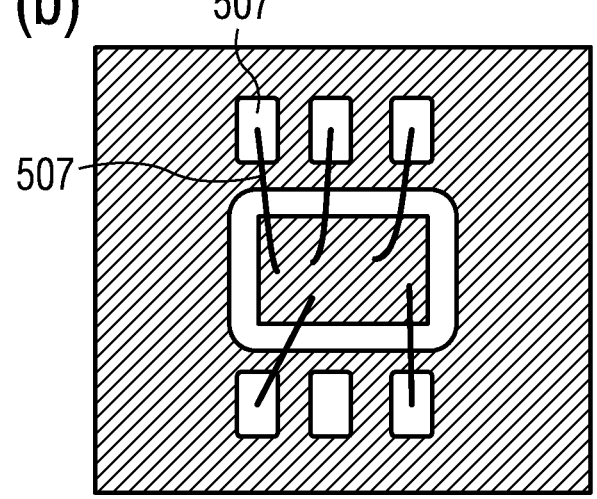

According to the above embodiments of FIGS. 4-6, the tin layer can be easily plated after die bond and wire bond. Adhesion to the encapsulation layer may be enhanced by the tin layer plated over the conductive part of the carrier and the interconnections.

In addition, since molding temperature in forming the encapsulation layer which may include a mold compound, for example, is lower than the melting temperature (232° C.) of tin, the tin layer will not melt during the depositing of the mold compound layer.

Figure 7:
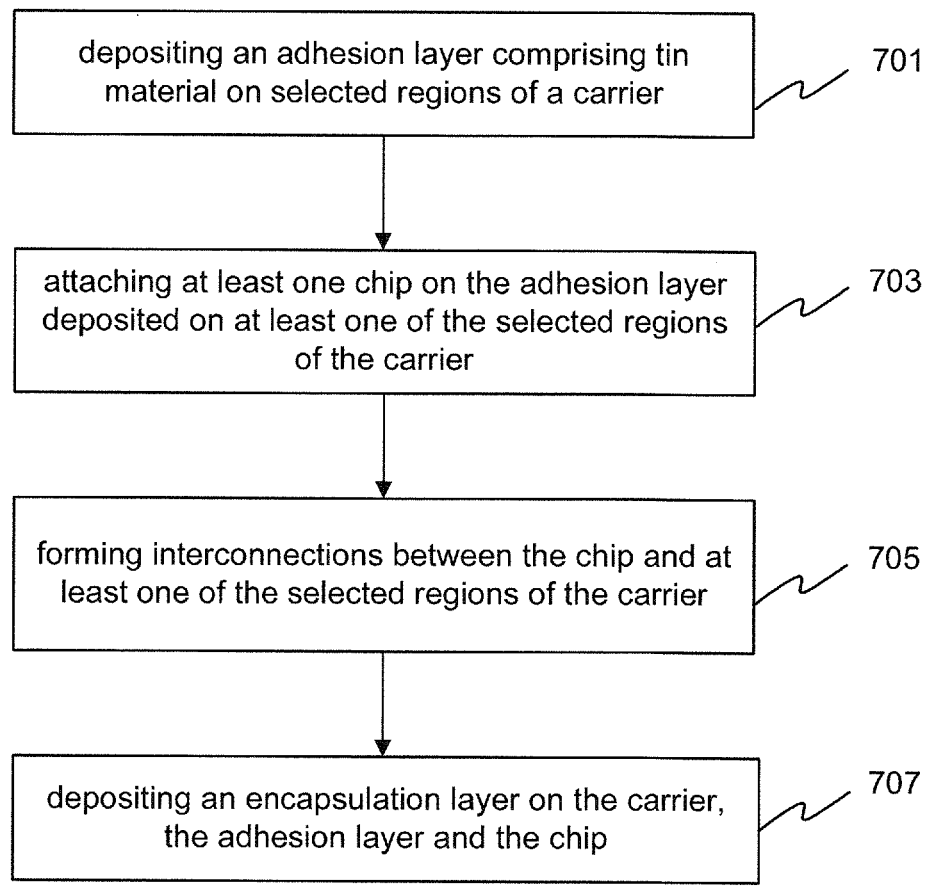
FIG. 7 shows a flowchart illustrating a method of forming a chip package according to a further embodiment.

FIG. 7 shows a flowchart illustrating a method of forming a chip package according to a further embodiment.

At 701, an adhesion layer including tin material is deposited on selected regions of a carrier. In an embodiment, the adhesion layer may be deposited on selected regions of a leadframe, wherein the leadframe may be formed on or as the carrier.

In an embodiment, the selected regions of the carrier may be the regions wherein chips are to be attached or where interconnections are to be formed. The adhesion layer is selected deposited on the selected regions of the carrier, e.g. by plating or coating.

In another embodiment, the adhesion layer including tin material may also be deposited under the carrier.

The adhesion layer may include a tin alloy material, or may include a tin layer along with other metal layers.

At 703, at least one chip is attached on the adhesion layer deposited on at least one of the selected regions of the carrier.

At 705, interconnections between the chip and at least one of the selected regions of the carrier are formed. In an embodiment, the interconnection may be formed via wire bonding.

At 707, an encapsulation layer is deposited on the carrier, the adhesion layer and the chip.

Figure 8A:
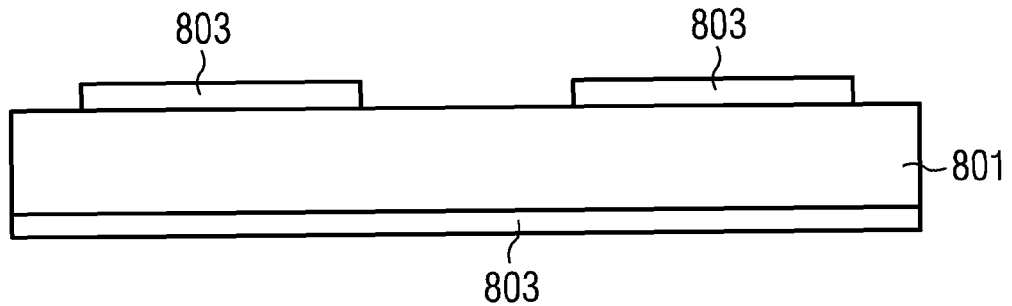
FIGS. 8A-8C illustrate a process for forming a chip package according to one embodiment.
Figure 8B:
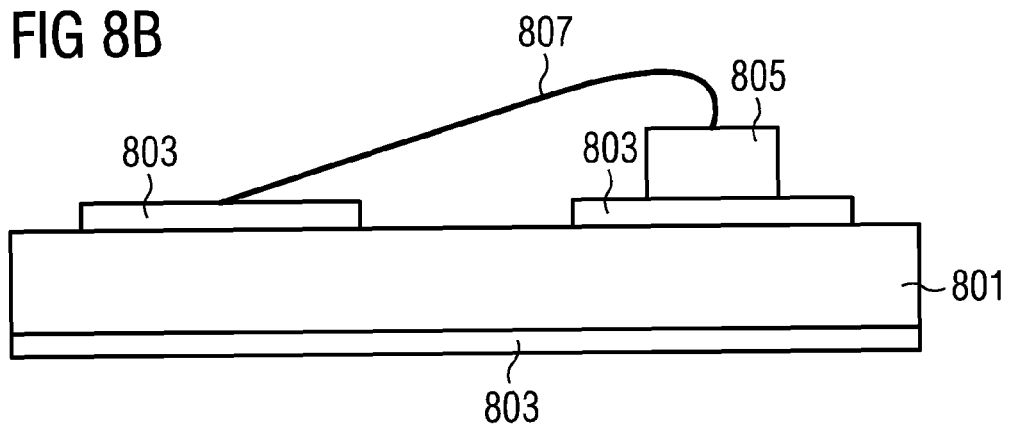
Figure 8C:
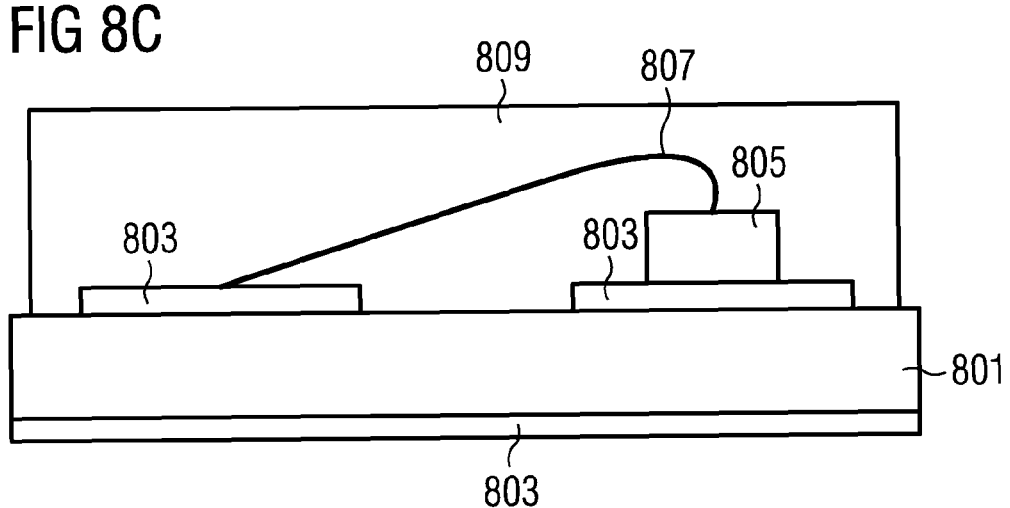

FIGS. 8A-8C illustrate a process for forming a chip package according to one embodiment.

In FIG. 8A, an adhesion layer 803 including tin material is deposited on selected regions of a carrier 801. In an embodiment, the selected regions of the carrier 801 may be the regions wherein chips are to be attached or where interconnections are to be formed.

In one embodiment, the adhesion layer 803 including an AgSn alloy is selectively plated on the carrier 801. In an example, the adhesion layer 803 may include 20% Ag and 80% Sn. In other examples, the adhesion layer 803 may include Ag and Sn of other suitable proportions which provides desired adhesion strength. In an embodiment, the adhesion layer 803 may have a thickness of at least 2 μm.

In another embodiment, the adhesion layer 803 may include a tin gold (AuSn) alloy with suitable proportion between tin and gold, so as to enhance adhesion strength between the carrier and an encapsulation layer. In other embodiments, the adhesion layer 803 may include other suitable tin alloy, such as tin copper alloy, tin palladium alloy, or tin nickel alloy. The adhesion layer 803 may be formed with a thickness of minimum 2 μm, so as to ensure good adhesion to an encapsulation layer later on.

In this embodiment, since the tin alloy layer 803 is deposited before die bonding and wire bonding, it is also referred to as a Sn alloy pre-plate layer.

The adhesion layer 803 may be deposited by electrolytic plating in one example, or by immersion plating in another example.

In another embodiment, the adhesion layer 803 may also be deposited under the carrier 801, e.g. to cover the backside of the carrier 801, e.g., for making solder pads under the carrier 801.

In other embodiments, the adhesion layer 803 may be plated all over the carrier 801, without requiring selective plating technology.

In FIG. 8B, at least one chip 805 is attached on the adhesion layer 803 deposited on at least one of the selected regions of the carrier 801. The chip 805 may be attached on the adhesion layer 803 by die bonding. In an embodiment, the chip 805 may be attached on the adhesion layer 803 by epoxy bonding or eutectic bonding.

An interconnection 807 between the chip 805 and at least one of the selected regions of the carrier is formed. In an embodiment, the interconnection 807 may be formed via wire bonding. In some embodiments, the interconnection 807 may be formed using solder bond, aluminum wire bond, gold wire bond, or copper wire bond by thermosonic bonding or laser bonding.

In FIG. 8C, an encapsulation layer 809 is deposited on the carrier 801, the adhesion layer 803 and the chip 805, thereby forming a chip package according to an embodiment. The encapsulation layer 809 may be deposited by compression molding, transfer molding, injection molding, or other suitable processes.

In an embodiment, the encapsulation layer 809 may include an encapsulation material. The encapsulation material may include at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

According to an embodiment, the AgSn alloy is coated at the chip bonding side of the carrier, and may also be coated at the backside of the carrier opposite to the chip, before chip bonding and wire bonding. The high melting temperature (about 350° C.) of AgSn (20/80) alloy enables eutectic die bond and wire bond, without causing the plated AgSn alloy to melt. The conductive AgSn layer has minimum impact to the die and wire bondability. This tin alloy layer may enhance the adhesion strength to the encapsulation layer due to the low isoelectric points of surface (IEPS) of AgSn alloy, and at the same time achieve good bondability.

Figure 9A:
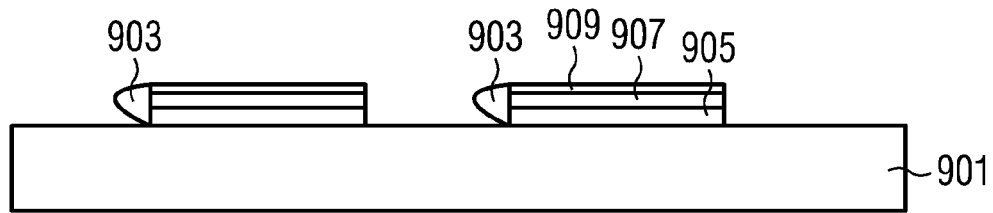
FIGS. 9A-9C illustrate a process for forming a chip package according to another embodiment.
Figure 9B:
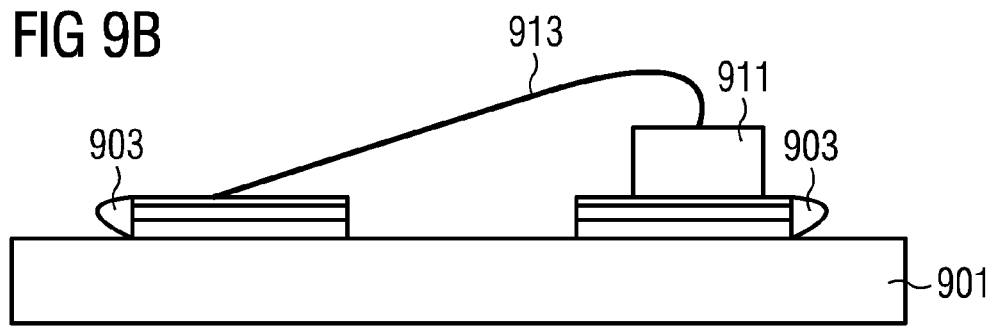
Figure 9C:
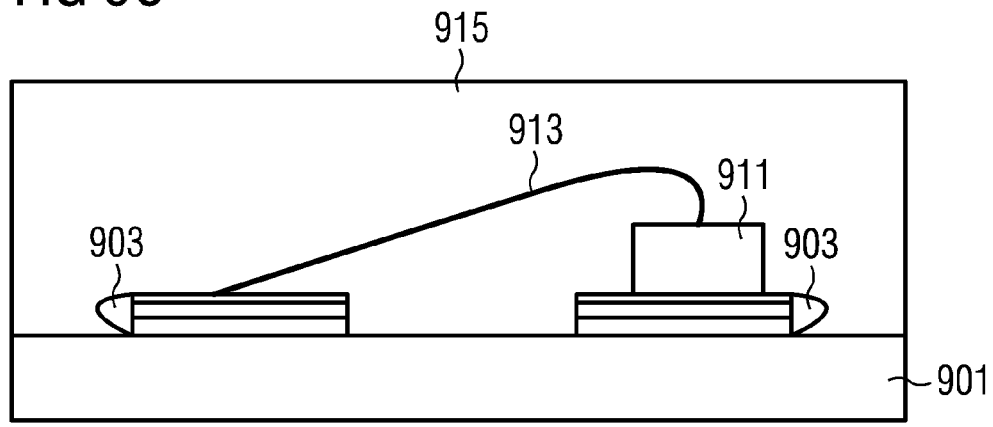

FIGS. 9A-9C illustrate a process for forming a chip package according to another embodiment.

In FIG. 9A, an adhesion layer 903 including tin material is deposited on selected regions of a carrier 901. In an embodiment, the selected regions of the carrier 901 may be the regions wherein chips are to be attached or where interconnections are to be formed. In another embodiment, the adhesion layer may also be deposited under the carrier 901 (not shown), e.g., for making solder pads under the carrier 901.

In one embodiment, the adhesion layer 903 may be an AgSnAg layer formed by selective AgSnAg flash plating layer by layer. The forming of the adhesion layer 903 may be a process of 10 minutes to 30 minutes under a temperature of about 200° C. The adhesion layer 903 may include a tin layer 907 sandwiched between a first silver layer 905 and a second silver layer 909. The first silver layer 905 may prevent diffusion of carrier material, e.g. copper, to the tin layer 907. The tin interlayer 907 may enhance the adhesion strength. The second silver layer 909 may enable wire bond and die bond between the chip and the carrier 901.

In an embodiment, the tin layer 907 may have a thickness of about 2 µm to 3 µm; the first silver layer 905 contacts with the carrier 901 and may have a thickness of about 1 µm to 2 µm; and the second silver layer 909 may have a thickness of about 0.1 µm to 1 µm. In another embodiment, the thickness of the first silver layer 905, the tin layer 907, and the second silver layer 909 may be about 2 µm to 4 µm, 2 µm to 4 µm, and 0.5 µm to 1 µm, respectively. The tin layer 907, the first silver layer 905 and the second silver layer 909 may be formed in other suitable thicknesses to achieve the respective function of the respective layer.

In this embodiment, since the AgSnAg layer 903 is deposited before die bonding and wire bonding, it is also referred to as an AgSnAg pre-plate layer.

In another embodiment, the adhesion layer 903 may include a tin layer 907 sandwiched between a first silver layer 905 and a second organic coating layer 909 (e.g. self assembled monolayer). The first silver layer 905 may have a thickness of about 2 µm to 4 µm, and the tin layer 907 may have a thickness of about 2 µm to 4 µm.

In a further embodiment, the adhesion layer 903 may be a multi-layer structure, including a Ni layer of about 0.5 µm to 1 µm, a Pd layer of about 0.01 µm to 0.03 µm, an AgSn alloy layer (e.g. 20% Ag and 80% Sn) of about 2 µm to 4 µm, and an organic coating layer (self assembled monolayer) in sequence. In a further embodiment, the adhesion layer 903 may include an AgSn alloy layer (e.g. 20% Ag and 80% Sn) of about 2 µm to 4 µm and an organic coating layer (self assembled monolayer).

In FIG. 9B, at least one chip 911 is attached on the adhesion layer 903 deposited on at least one of the selected regions of the carrier 901. The chip 911 may be attached on the adhesion layer 903 by die bonding. In an embodiment, the chip 911 may be attached on the adhesion layer 903 by epoxy bonding or eutectic bonding.

An interconnection 913 between the chip 911 and at least one of the selected regions of the carrier 901 is formed. In an embodiment, the interconnection 913 may be formed via wire bonding. In some embodiments, the interconnection 913 may be formed using solder bond, aluminum wire bond, gold wire bond, or copper wire bond by thermosonic bonding or laser bonding.

In FIG. 9C, an encapsulation layer 915 is deposited on the carrier 901, the adhesion layer 903 and the chip 911, thereby forming a chip package according to an embodiment. The encapsulation layer 915 may be deposited by compression molding, transfer molding, injection molding, or other suitable processes.

In an embodiment, the encapsulation layer 915 may include an encapsulation material. The encapsulation material may include at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

The various embodiments described above are based on the low isoelectric point of a surface (IEPS) of tin material, which has good adhesion to encapsulation (e.g. mold compound) and enhances adhesion strength on mold compound. IEPS is the pH at which the electric charge of a surface is neutral with regard to its acid/base and electron donor-acceptor reactions.

As shown in FIG. 10, tin (Sn) has a low IEPS value compared with many other metal materials.

Accordingly, the various embodiments introduce a layer including tin or tin alloy on the carrier by electrolytic plating, thereby enhancing the adhesion strength to mold compound.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of forming a chip package, the method comprising:
    attaching at least one chip on a carrier, the chip comprising a plurality of chip pads on a surface of the chip opposite to the carrier;
    depositing a first adhesion layer on the carrier and on the chip pads of the chip, the first adhesion layer comprising tin or indium;
    depositing a second adhesion layer on the first adhesion layer, the second adhesion layer comprising a silane organic material; and
    depositing a lamination layer or an encapsulation layer on the second adhesion layer and the chip.

2. The method of claim 1,
    wherein attaching at least one chip on a carrier comprises attaching at least one chip on a leadframe.

3. The method of claim 1,
    wherein the first adhesion layer comprises pure tin or a tin alloy, the tin alloy comprising tin and one or more other metals.

4. The method of claim 1,
    wherein the first adhesion layer comprises a tin nickel alloy, a tin lead alloy, a tin silver alloy, or a tin copper alloy.

5. The method of claim 1,
    wherein the first adhesion layer comprises pure indium or an indium alloy, the indium alloy comprising indium and one or more other metals.

6. The method of claim 1, further comprising:
    forming a plurality of vias to selected chip pads and selected region of the carrier, the vias extending through the lamination layer or the encapsulation layer, the first adhesion layer and the second adhesion layer.

7. The method of claim 1, further comprising:
forming the plurality of vias by laser drilling.

8. The method of claim 6, further comprising:
galvanically filling the plurality of vias with electrically conductive material.

9. The method of claim 1, wherein
the lamination layer comprises a resin-coated-copper material.

\* \* \* \* \*